(12) United States Patent
Takamura et al.

(10) Patent No.: US 7,196,467 B2
(45) Date of Patent: Mar. 27, 2007

(54) ORGANIC EL DISPLAY PANEL COMPRISING ELECTRODE SEPARATOR AND ITS MANUFACTURING METHOD

(75) Inventors: Makoto Takamura, Kyoto (JP); Koji Terumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/506,133

(22) PCT Filed: Feb. 28, 2003

(86) PCT No.: PCT/JP03/02303

§ 371 (c)(1),
(2), (4) Date: Aug. 31, 2004

(87) PCT Pub. No.: WO03/075616

PCT Pub. Date: Dec. 9, 2003

(65) Prior Publication Data

US 2005/0116629 A1    Jun. 2, 2005

(30) Foreign Application Priority Data

Mar. 4, 2002    (JP)    .............................. 2002-057488

(51) Int. Cl.
  *H01J 1/62* (2006.01)
(52) U.S. Cl. ...................... 313/506; 313/504
(58) Field of Classification Search ........ 313/489–509, 313/582–587
  See application file for complete search history.

(56) References Cited

U.S. PATENT DOCUMENTS 5,962,970 A *  10/1999  Yokoi et al. ................ 313/506
6,157,127 A    12/2000  Hosokawa et al.
6,280,273 B1 *  8/2001  Codama ...................... 445/24
6,320,311 B2 *  11/2001  Nakaya et al. .............. 313/506
6,525,467 B1 *  2/2003  Eida et al. .................. 313/506
2001/0024083 A1  9/2001  Yamazuaki et al.
2002/0008467 A1  1/2002  Nagayama et al.
2002/0072139 A1 *  6/2002  Kashiwabara ................ 438/29

FOREIGN PATENT DOCUMENTS

JP    4-51494    2/1992
JP    11-339970    12/1999

(Continued)

OTHER PUBLICATIONS

JPO machine translation of JP 2001-345185.*

*Primary Examiner*—Joseph Williams
*Assistant Examiner*—Bumsuk Won
(74) *Attorney, Agent, or Firm*—Hamre, Schumann, Mueller & Larson, P.C.

(57) ABSTRACT

An organic EL display panel includes a plurality of anodes (2) formed on a substrate (1), a plurality of auxiliary electrodes (3) held in electrical contact with the anodes (2), an anode separator (4) covering each auxiliary electrode (3) and a part of the anodes (2), a plurality of organic EL strips (5) formed to cover the anode separator (4), a plurality of cathodes (6) layered over the organic El strips (5) and extending to cross the anodes (2), and a plurality of cathode separators (7) separating among the cathodes (6) and extending to cross the anodes (2). Each of the auxiliary electrodes (3) is severed at a position where the auxiliary electrode crosses the cathode separators (7).

6 Claims, 13 Drawing Sheets

FOREIGN PATENT DOCUMENTS

| | | |
|---|---|---|
| JP | 1 079 668 | 2/2001 |
| JP | 2001-57290 | 2/2001 |
| JP | 2001-223087 | 8/2001 |
| JP | 2001-345185 | 12/2001 |
| JP | 2001-351782 | 12/2001 |
| WO | WO 97/34447 | 9/1997 |
| WO | WO 01/39272 | 5/2001 |

* cited by examiner

ORGANIC EL DISPLAY PANEL COMPRISING ELECTRODE SEPARATOR AND ITS MANUFACTURING METHOD

TECHNICAL FIELD

The present invention relates to an organic EL display panel used as a display for image display, while also relating to a manufacturing method of such a panel.

BACKGROUND ART

An anode of an organic EL display panel is normally a transparent electrode formed from an ITO film. Compared with general metals used for an electrode, the electrical resistance of the ITO film is high. Also unlike a liquid crystal display panel driven by voltage, an organic EL display panel is driven by current. Thus, with high wire resistance, the signal voltage tends to drop, and signal waveforms tend to loose sharpness. The drop of signal voltage and loss of sharpness of signal waveforms should be prevented because they cause a brightness unevenness on the display screen and an irregularity of color balance in full color mode. These phenomena particularly occur in a simple matrix type where large current flows momentarily, and tend to occur more easily as the panel size becomes larger. Referring to FIG. 12, a conventional solution for this is to provide an auxiliary electrode 92 made of e.g. chrome on an anode 91 formed of an ITO film.

The organic EL display panel illustrated in FIG. 12 is a simple matrix type, where a plurality of anodes 91 and auxiliary electrodes 92, formed on a transparent substrate 90, extend in a direction and are lined up with spaces in another direction perpendicular to the first direction. On the anodes 91 and auxiliary electrodes 92, a plurality of organic EL strips 93, cathodes 94 and cathode separators 95 are layered extending in one direction perpendicular to the above electrodes, and are lined up with spaces in a longitudinal direction of the electrodes. The cathode separators 95 are for electrical insulation between adjacent cathodes 94. The light emitted from the organic EL strips 93 transmit through the anodes 91 and the substrate 90, and travel downward. Thus, each auxiliary electrode 92 on an anode 91 is formed not to cover the anode 91 entirely, but to be locally disposed along one of the longitudinal edges of the anode 91.

The combination of the anodes 91 and the auxiliary electrodes 92 serves to decrease their electrical resistance as a whole, whereby the problem mentioned above can be solved or alleviated.

However, in the conventional structure, the auxiliary electrodes 92 extend over almost the full length of the anodes 91 in the longitudinal direction, which causes the following problem.

As FIG. 13a shows, cathode separators 95 are formed by forming a resist film 95A on the anodes 91 and auxiliary electrodes 92, and then performing exposure of light and development processing on the resist film 95A using a photolithography method. The resist film 95A is a negative type. In the prior art, when light exposure is performed on the portions 95', which correspond to the cathode separators 95, of the resist film 95A using the mask 99, the light which transmits through this portion 95' is reflected and scattered upward by the auxiliary electrodes 92. The auxiliary electrodes 92, made of chrome, have high light reflectance. This causes the portion near the bottom surface of the resist film 95A to be sensitized by the reflected light. So when the development processing is performed after this, the cathode separators 95 present a cross-sectional profile broadening toward the bottom, as seen in FIG. 13b.

If the cathode separators 95 have a profile broadening toward the bottom in this way, when the organic EL strips 93 and cathodes 94 are formed by deposition, as shown in FIG. 14, the film is formed not only on the top surfaces 95a of the cathode separators 95 but also on the side surfaces 95b and 95c thereof. This causes the adjacent cathodes 94, sandwiching the cathode separator 95, to be electrically conducted, which is not appropriate. It is possible to electrically insulate the adjacent cathodes 94 by partially removing the top area of the cathode separator 95 by etching. Even with such processing, the films of the organic EL strip 93 and cathode 94 remain on both side surfaces 95b and 95c of the cathode separators 95. This is not desirable in terms of insulation of the adjacent cathodes 94 sandwiching the cathode separators 95.

DISCLOSURE OF THE INVENTION

With the foregoing in view, it is an object of the present invention to provide an organic EL display panel that can solve or lessen the abovementioned problem.

It is another object of the present invention to provide a manufacturing method for such an organic EL display panel.

According to a first aspect of the present invention, there is provided an organic EL display panel that comprises a plurality of metal auxiliary electrodes formed on a substrate, and a plurality of electrode separators extending above the auxiliary electrodes to cross the auxiliary electrodes. In the organic EL display panel, each of the auxiliary electrodes is severed at a position where the auxiliary electrode crosses each of the electrode separators.

With such an arrangement, even if the light used for exposure travels directly under the portion to be edges of the insulation layer when the electrode separators are formed by a photolithography method, the light is not reflected nor scattered by the auxiliary electrodes. Therefore, the edges of the electrode separators are finished to be a desired appropriate shape.

The organic EL display panel according to an embodiment of the present invention may further comprise a plurality of transparent anodes formed on the substrate, a plurality of organic EL strips that cover the anodes and extend to cross the anodes, and a plurality of cathodes covering the organic EL strips and extending to cross the anodes. In this case, the auxiliary electrodes are in electrical contact with the anodes, respectively. The electrode separator is a cathode separator formed between the plurality of cathodes, and each of the auxiliary electrodes is severed at a position where the auxiliary electrode crosses each of the cathode separators. Preferably, the cathode separator may be formed by a negative resist.

The organic EL display panel may further comprise an anode separator covering the auxiliary electrodes and a part of the anodes. In this case, it is preferable that the anode separator is formed with an opening between the adjacent cathode separators. Also it is preferable that each of the auxiliary electrodes is arranged to avoid the opening. It is also preferable that the anode separator is formed by a positive resist.

According to a second aspect of the present invention, there is provided an organic EL display panel that comprises a plurality of anodes formed on a substrate to extend in one direction, a plurality of metal auxiliary electrodes held in electrical contact with the anodes, an anode separator covering the auxiliary electrodes and a part of the anodes and being formed with an opening on each of the anodes, a plurality of organic EL strips formed to cover the anode separator and partially enter the openings to contact the plurality of anodes, a plurality of cathodes layered on the organic EL strips and extending to cross the anodes, and a plurality of cathode separators separating between the cathodes and extending to cross the anodes. In the organic EL display panel, each of the auxiliary electrodes is arranged to avoid each of the cathode separators and the openings.

Preferably, the auxiliary electrode may be overlayed at least on one side of the longitude edges of each of the anodes, and may extend along the one particular edge.

According to another embodiment of the second aspect, the auxiliary electrode may be a rectangular loop surrounding each opening of each of the anode separators.

According to a third aspect of the present invention, there is provided a manufacturing method for an organic EL display panel, the method comprising the steps of forming a plurality of metal auxiliary electrodes on a substrate, and forming a plurality of electrode separators over the auxiliary electrodes by performing light exposure and development on a resist, the electrode separators extending to cross the auxiliary electrodes. In the manufacturing method, the step of forming the auxiliary electrodes is performed such that the auxiliary electrode is severed at a position where the auxiliary electrode crosses each of the electrode separators.

According to a fourth aspect of the present invention, there is provided a manufacturing method for an organic EL display panel, the method comprising the steps of: forming a plurality of anodes on a substrate; forming a plurality of metal auxiliary electrodes held in electrical contact with the anodes; forming an anode separator covering the auxiliary electrodes and a part of the anodes, the anode separator being formed with an opening on each of the anodes by performing light exposure and development on a resist; forming a plurality of organic EL strips on the anode separator; and forming a plurality of cathodes covering the organic EL strips. In the manufacturing method, the step of forming each of the auxiliary electrodes is performed such that the auxiliary electrode avoids the positions to be the opening of the anode separator.

The other features and advantages of the present invention will be clarified by the description on the preferred embodiments herein below.

BRIEF DESCRIPTION OF THE DRAWINGS

FIG. 10b is a perspective plan view depicting the display panel in FIG. 10a;

BEST MODE FOR CARRYING OUT THE INVENTION

Embodiments of the present invention will now be described below with reference to the drawings.

Figure 1:
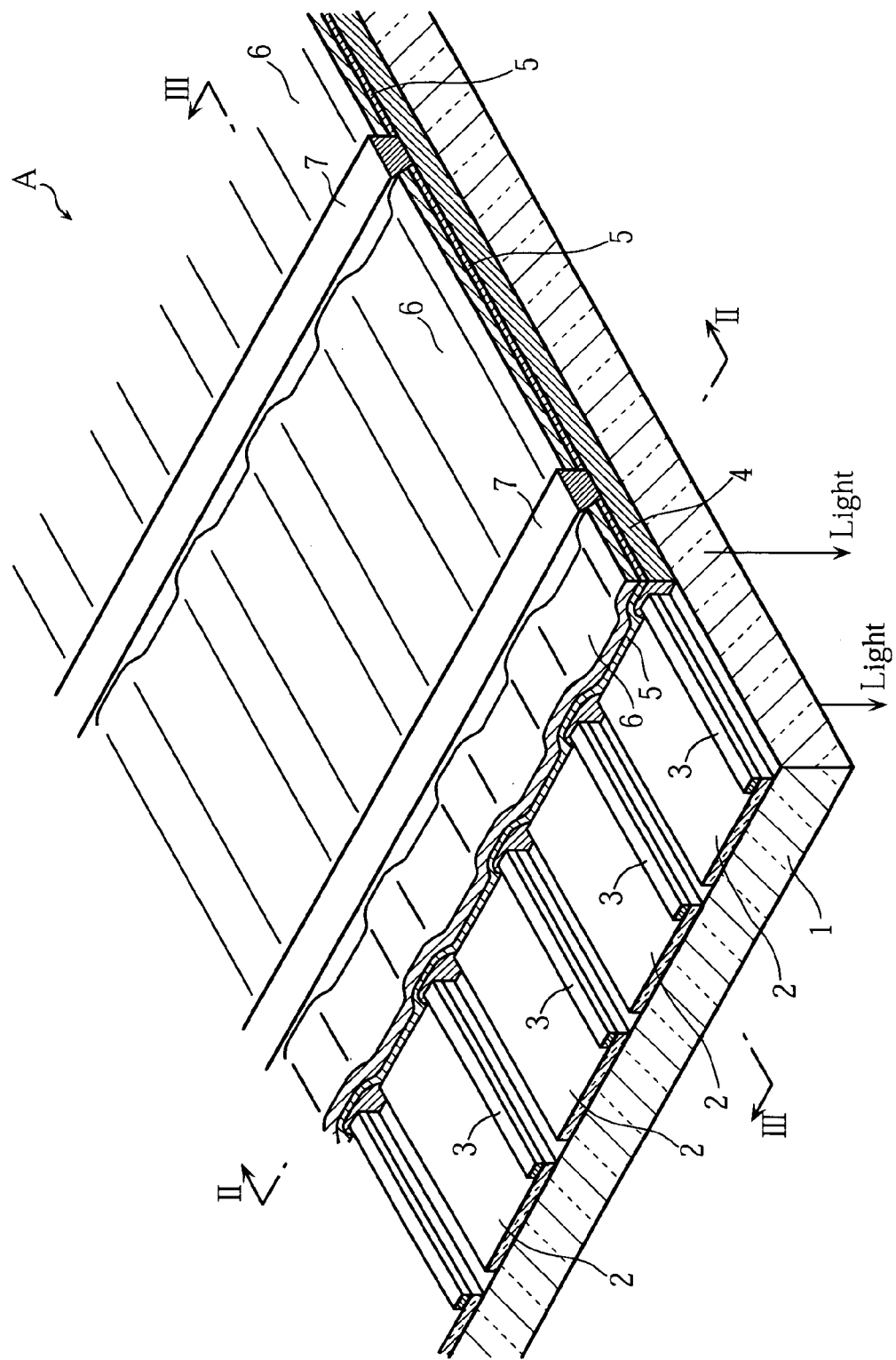
FIG. 1 is a partial perspective cross-sectional view depicting the organic EL display panel according to an embodiment of the present invention.

FIG. 1 to FIG. 4 show a first embodiment of the present invention. As shown in FIG. 1, the organic EL display panel A of the present embodiment is a simple matrix type, having a configuration where a plurality of anodes 2, a plurality of auxiliary electrodes 3, an anode separator 4, a plurality of organic EL strips 5, a plurality of cathodes 6 and a plurality of cathode separators 7 are formed on the top surface of the substrate 1, which is made of a transparent glass.

Figure 3:
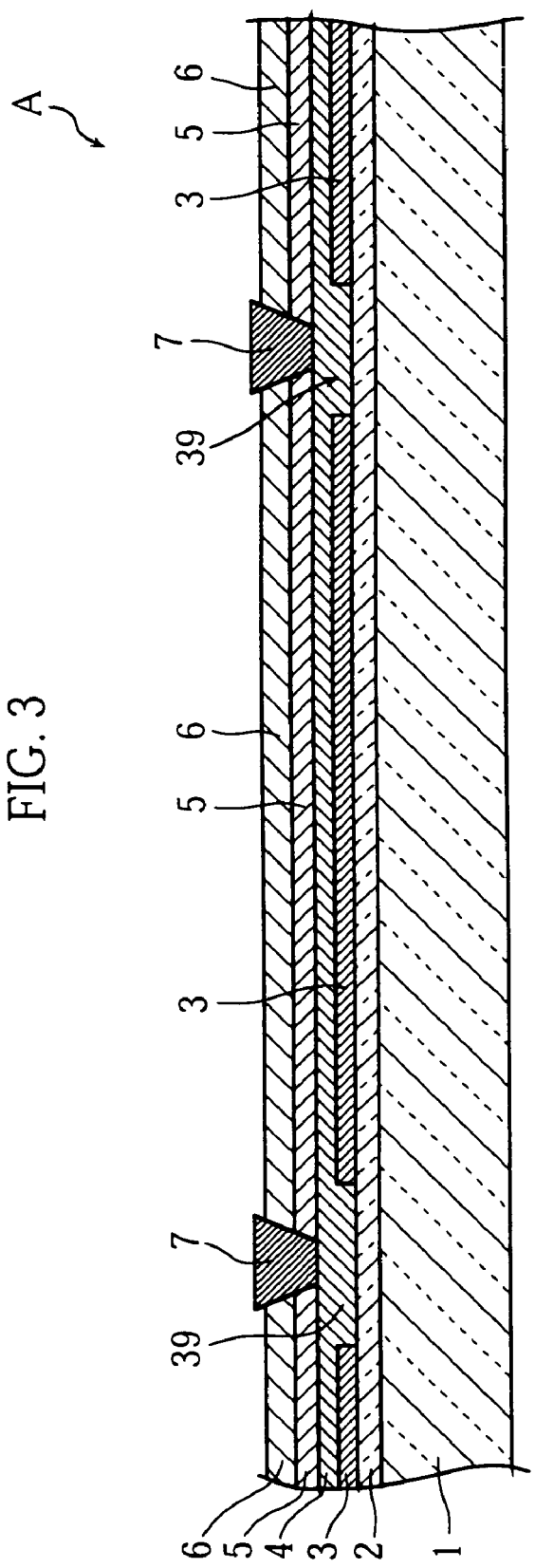
FIG. 3 is a cross-sectional view of III—III in FIG. 1.

A plurality of anodes 2 are transparent electrodes formed by an ITO film, and are lined up in strips (elongated) extending in one direction with spaces in the width direction. Each auxiliary electrode 3, disposed for decreasing the wire resistance, is layered at one side of the edges of each anode 2 so as not to cover the entire area of the anode 2. Each auxiliary electrode 3 extends in the longitudinal direction of each anode 2, but a severed section 39 is formed directly under each cathode separator 7, as shown in FIG. 3. The material of each auxiliary electrode 3 is chrome, for example. Chrome has good adhesion to ITO film and has excellent corrosive resistance. However other metal, such an aluminum, may be used instead.

Figure 2:
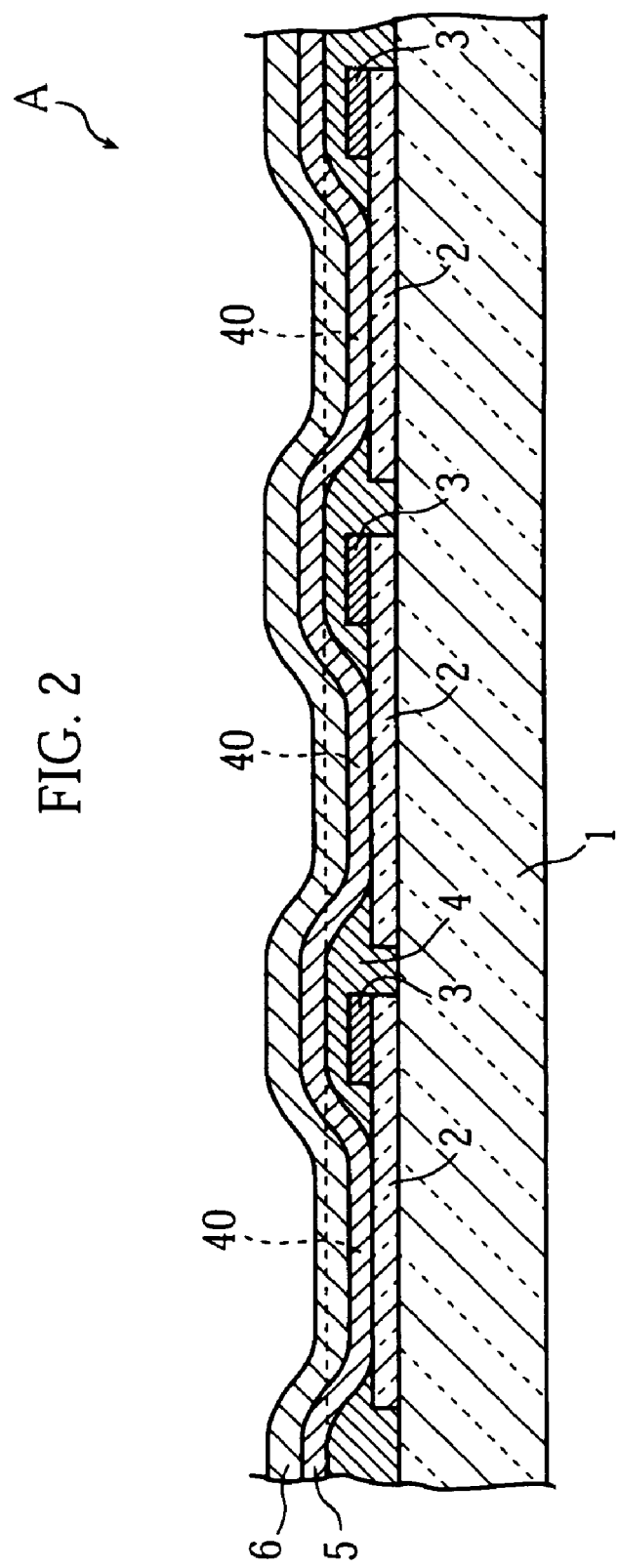
FIG. 2 is a cross-sectional view of II—II in FIG. 1.
Figure 4:
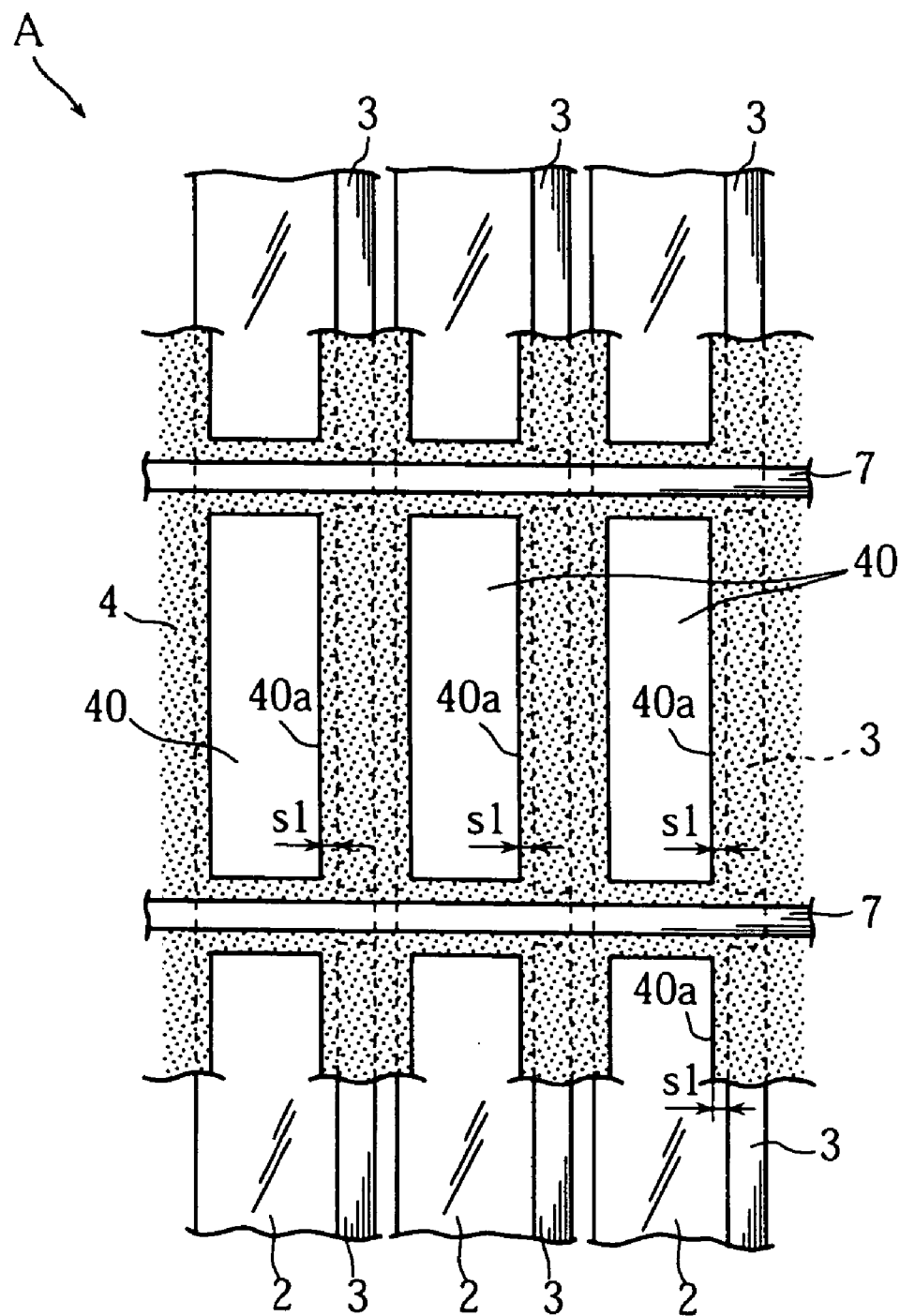
FIG. 4 is a partial perspective plan view depicting the display panel shown in FIG. 1.

The anode separator 4 separates the anodes 2 adjacent to each other, as shown in FIG. 2, and covers the entire area of each auxiliary electrode 3 and a part of each anode 2. This anode separator 4 is comprised of a single insulation layer, is formed by positive resist, and has a plurality of openings 40 on each anode 2, as described later. As shown in FIG. 4, each opening 40 is rectangular, for example. In FIG. 4, the organic EL strips 5 and cathodes 6 are omitted, and the anode separator 4 is shown by half tone dots. Each auxiliary electrode 3 is formed so as to avoid each opening 40. More specifically, each auxiliary electrode 3 is distant from the edge 40a of the nearest opening 40 for an appropriate dimension s1.

Each organic EL strip 5 comprises a light emitting layer (not illustrated) which emits light when electricity is turned ON using the anode 2 and cathode 6, and which is layered onto the anode separator 4 and extends in a direction perpendicular to the anode 2. A part of each organic EL strips 5 enters the opening 40 of the anode separator 4, so as to be directly sandwiched by the anode 2 and cathode 6, and this area serves as a light emitting area. The light emitted from this area transmits through the anode 2 and substrate 1, and travels downward. Each cathode 6 is formed by aluminum, for example, and is layered on each organic EL strip 5, and extends in a direction the same as each organic EL strip 5.

Each cathode separator 7 separates the cathodes 6 adjacent to each other, electrically insulating them. As shown in FIG. 1 and FIG. 3, each cathode separator 7 is formed on the anode separator 4, and extends in a direction the same as the cathodes 6 and organic EL strips 5. As described later, this cathode separator 7 is formed by negative photoresist.

Now a manufacturing method for the organic EL display panel A with the abovementioned configuration and its function will be described.

Figure 5A:
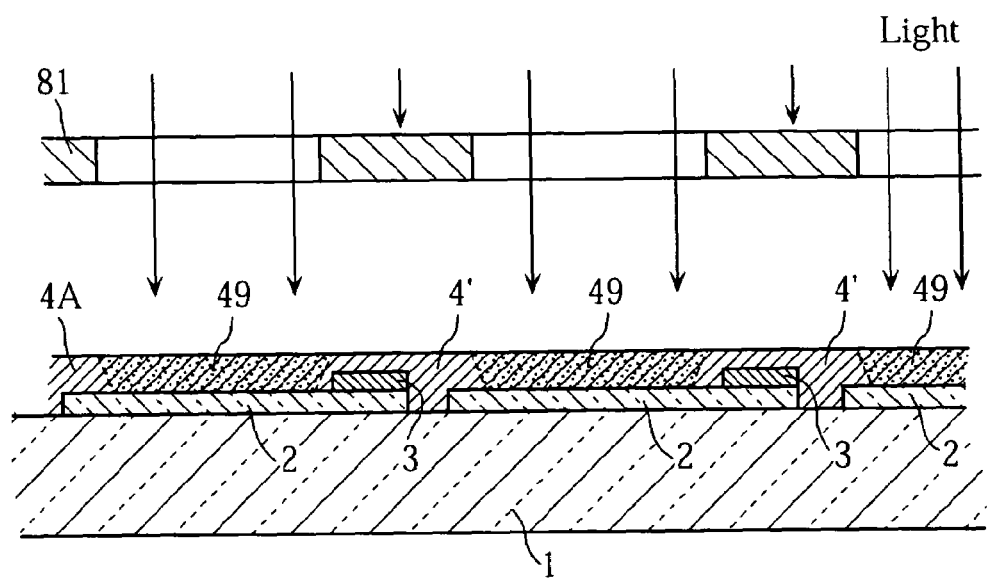
FIG. 5a and FIG. 5b are partial cross-sectional views depicting an example of the formation steps of the insulation layer of the display panel shown in FIG. 1.
Figure 5B:
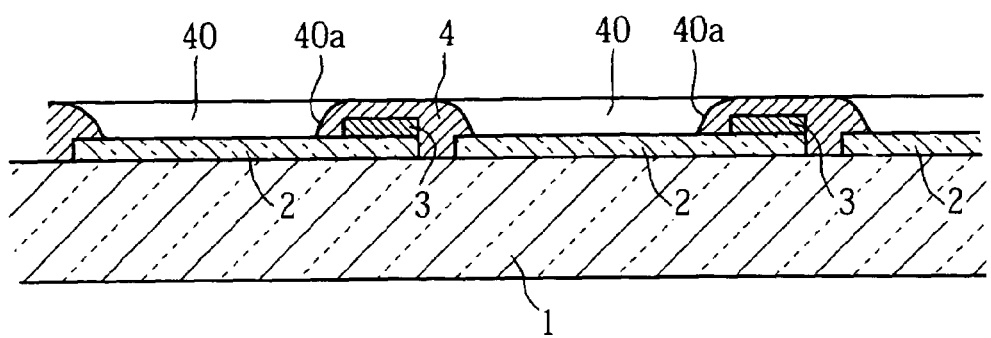

To manufacture the organic EL display panel A, a plurality of anodes 2 and plurality of auxiliary electrodes 3 are formed on the substrate 1, then the anode separator 4 is formed. The anode separator 4 is formed by a photolithography method using positive photoresist. More specifically, as shown in FIG. 5a, the resist film 4A that covers the plurality of anodes 2 and plurality of auxiliary electrodes 3 is formed on the substrate 1 first, then light exposure processing is performed. The mask for exposure 81 is for not irradiating light onto the portion 4', which will be formed as the anode separator 4, and for enabling irradiating light onto the other portions 49 (portions indicated by half tone dots). The boundary between the above mentioned portions 4' and 49 corresponds to the edge 40a of the opening 40 of the anode separator 4. The auxiliary electrode 3 is formed avoiding the opening 40, so the auxiliary electrode 3 does not reflect much light to the abovementioned boundary. On the other hand, the intensity of the light is weakened while the light is traveling inside the resist film 4A. Therefore the exposure amount of the portion 49 to be the exposure target is highest at the top surface of the resist film 4A and becomes less as it approaches the bottom surface, and the unexposed portion of the resist film 4A becomes wider as it approaches the rear surface of the resist 4A. Therefore, if development processing is performed after this and the unexposed portion which remains is used as the anode separator 4, the edge 40a of the opening 40 presents a shape which is smoothly inclined such that the opening width of the opening 40 becomes larger as it approaches the top, as shown in FIG. 5b.

Figure 6:
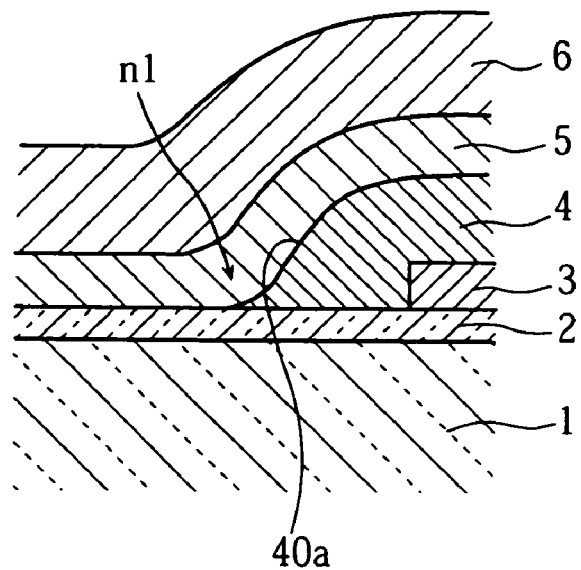
FIG. 6 is a partial enlarged cross-sectional view depicting the display panel shown in FIG. 1.
Figure 7:
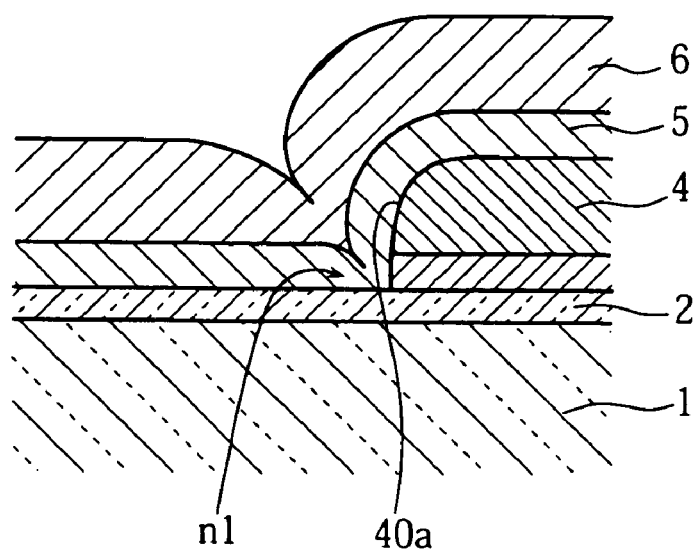
FIG. 7 is a partial enlarged cross-sectional view depicting an organic EL display panel according to a comparison example.

If the anode separator 4 is formed in this way, it is appropriate to form the organic EL strips 5 and cathodes 6 on the anode separator 4. FIG. 7 shows a comparison example with the present invention, and the corresponding composing elements in FIG. 7 and the present embodiments are denoted with the same reference numerals. In this comparison example, the edge 40a of the anode separator 4 rises from the surface of the anode 2 at an angle almost vertical. In such a configuration, when the organic EL strip 5 is formed on the anode 2 and the anode separator 4, it is difficult to appropriately form the organic EL strip 5 at the corner n1 around the edge 40a on the surface of the anode 2, and the thickness of the organic EL strip 5 tends to become extremely thin at the corner n1. This holds for the case of forming the cathode 6 on this organic EL strip 5. With this, the voltage resistance characteristic of the organic EL strip 5 and the cathode 6 becomes poor. According to the present embodiment, the inclination of the edge 40a of the anode separator 4 is mild, as shown in FIG. 6, so the corner section n1 opens widely and the organic EL strip 5 and cathode 6 can be appropriately formed on this area as well.

Figure 8:
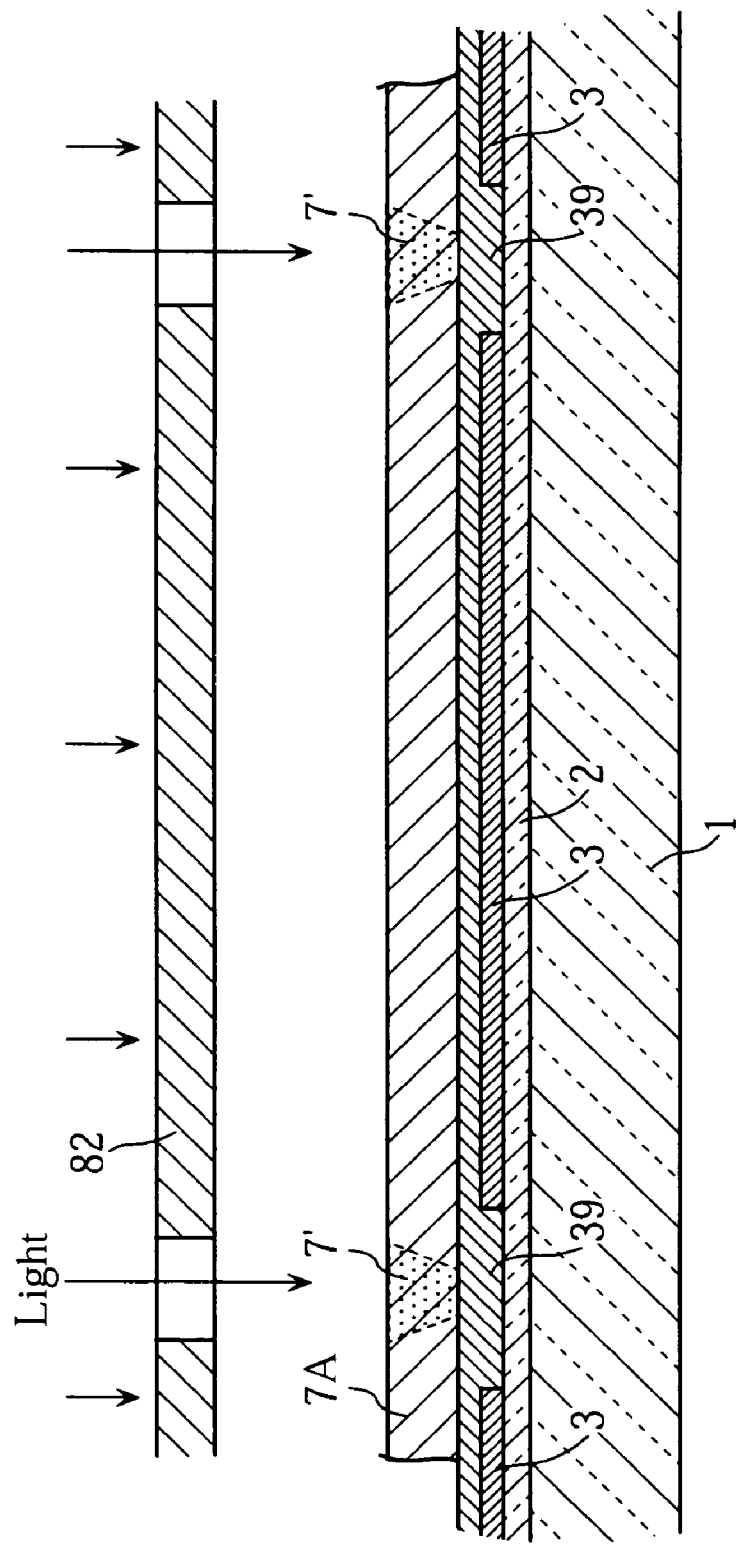
FIG. 8 is a partial cross-sectional view depicting an example of a formation step of the cathode separator of the display panel shown in FIG. 1.

After forming the anode separator 4, the cathode separator 7 is formed. The cathode separator 7 is formed by a photolithography method using negative photoresist, just like the case of the prior art. Specifically, as shown in FIG. 8, the resist film 7A is formed on the anode separator 4, then exposure is performed. The mask for exposure 82 enables exposure only onto the portion 7' (portion indicated by half tone dots) to be formed as the cathode separator 7. During this exposure processing, light may enter into the bottom of this portion 7' but the severed section 39 of the auxiliary electrode 3 is directly under the portion 7'. This prevents light from strongly reflecting and scattering upward by the auxiliary electrode 3. Therefore the exposure amount of the exposure target section of the resist film 7A is the maximum at the top surface of the resist film 7A, and becomes less as it approaches the bottom surface. So when the development processing is performed after this, the cathode separator 7 is formed to be a cross-sectional profile, which is narrower at the bottom than the top, the opposite of the case of the prior art.

Figure 9:
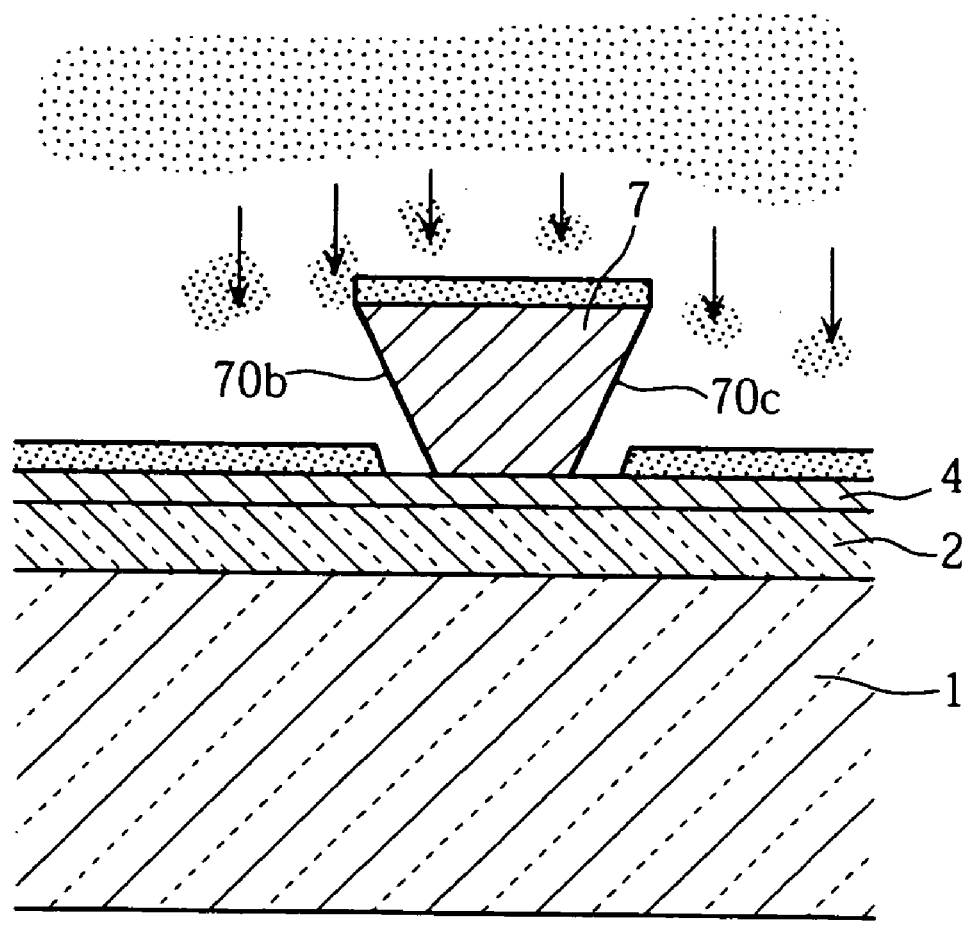
FIG. 9 is a partial enlarged cross-sectional view depicting an example of a film formation step according to the present invention.

If the cathode separator 7 is formed to have the cross-sectional profile described above, when the organic EL stripe 5 and cathode 6 are formed thereon by deposition, for example, these films are not formed on both side surfaces 70b and 70c of the cathode separator 7, as shown in FIG. 9. Therefore an electrical short can be prevented between the adjacent cathodes 6 sandwiching the cathode separator 7.

Figure 10A:
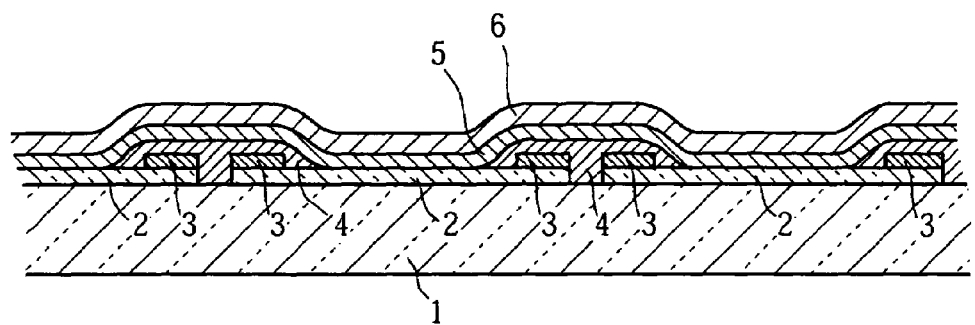
FIG. 10a is a partial cross-sectional view depicting an organic EL display panel according to another embodiment of the present invention.
Figure 10B:
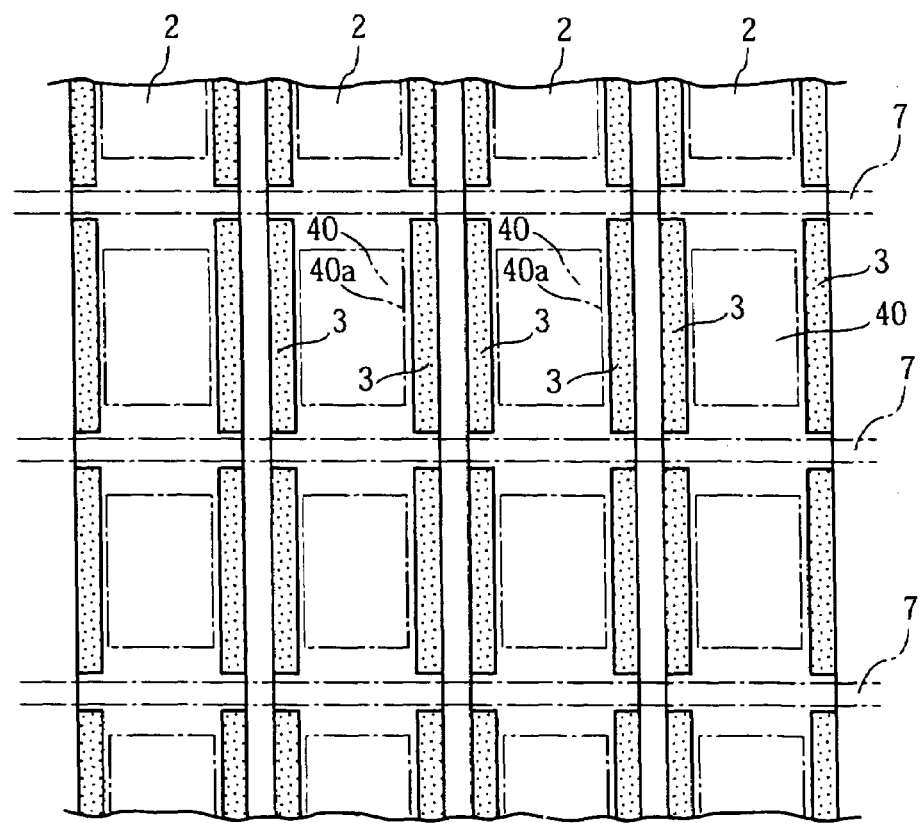
Figure 11:
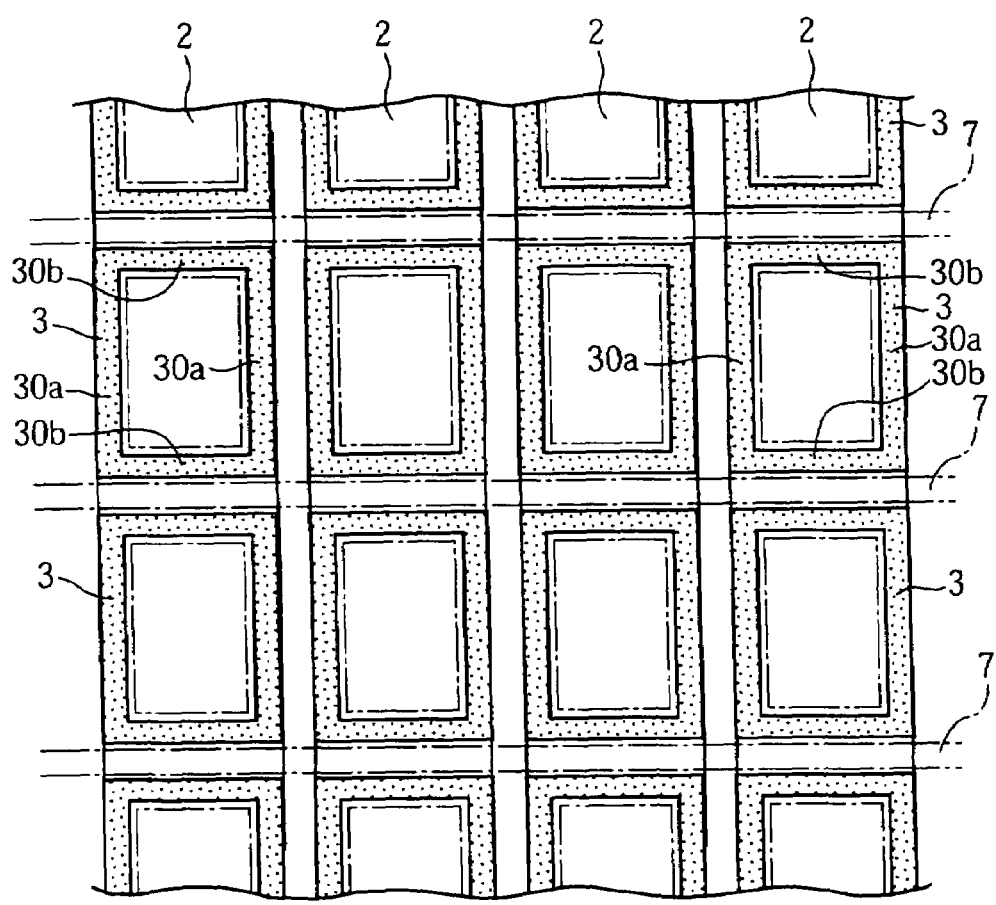
FIG. 11 is a partial perspective view depicting another embodiment of the present invention.
Figure 12:
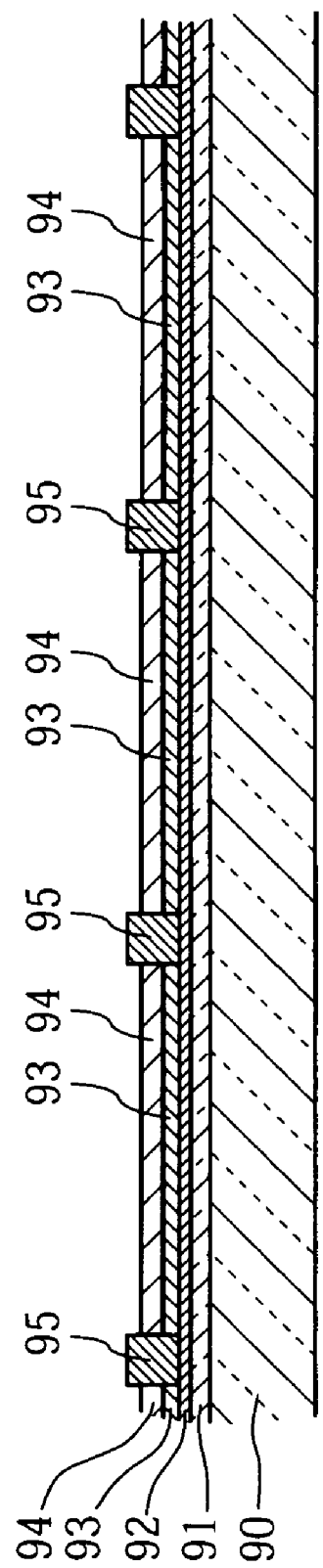
FIG. 12 is a partial cross-sectional view depicting a conventional organic EL display panel.
Figure 13A:
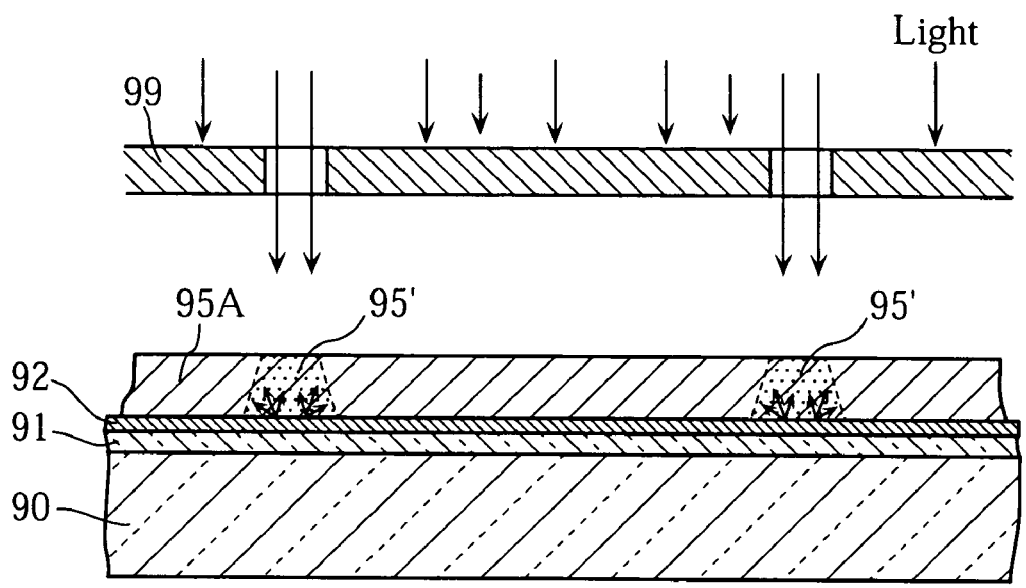
FIG. 13a and FIG. 13b are cross-sectional views depicting the formation steps of the cathode separator in a conventional display panel.
Figure 13B:
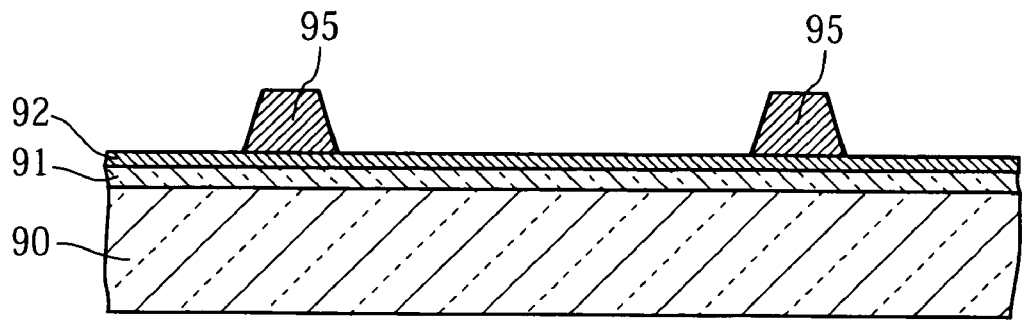
Figure 14:
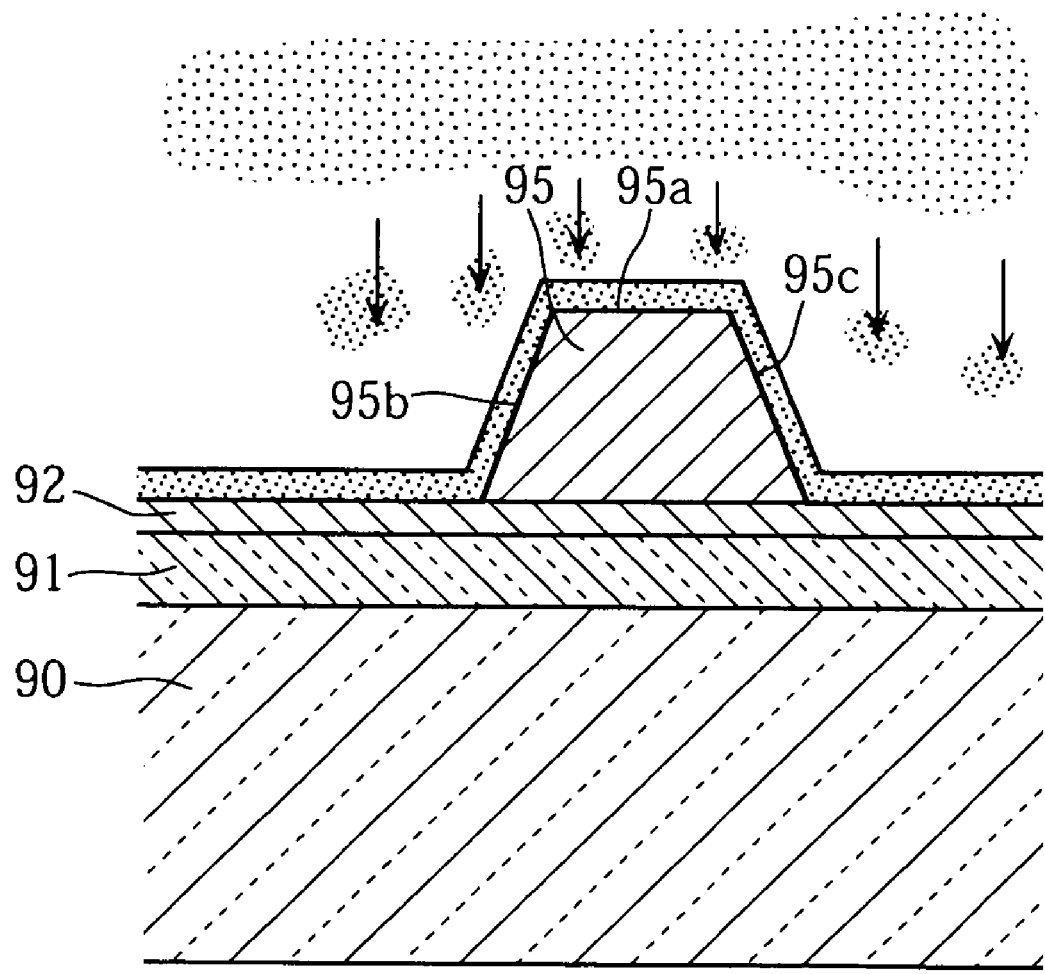
FIG. 14 is a partial enlarged cross-sectional view depicting an example of the film formation step according to the prior art.

FIG. 10a and FIG. 10b show a second embodiment of the present invention, while FIG. 11 shows a third embodiment. In these drawings, the same or similar composing elements as the first embodiment are denoted with the same reference numerals.

According to the second embodiment shown in FIG. 10a and FIG. 10b, a plurality of auxiliary electrodes 3 (half tone dot sections in FIG. 10b) are layered on both edges separated from each other in the width direction of each anode 2. Each auxiliary electrode 3 is formed directly under the cathode separator 7 so as to avoid the opening 40 of the anode separator 4. This configuration is preferable to increase the overall volume of the plurality of auxiliary electrodes 3 and to decrease the wire resistance compared with the case of forming the auxiliary electrode on only one side of the edges of each anode 2.

According to the third embodiment shown in FIG. 11, each auxiliary electrode 3 (half tone dot section) is a rectangular loop shape, comprised of a pair of strips 30a which extend in the longitudinal direction of each anode 2, and a pair of strips 30b which extend in the width direction of each anode 2 so as to connect both ends in the longitudinal direction of the pair of strips 30a. This configuration can further increase the volume of the auxiliary electrode 3, so the wire resistance can be decreased even more than the configuration shown in FIG. 10.

The present invention is not limited to the embodiments described above. The specific configuration of each part of the organic EL display panel according to the present invention may be changed in design in various ways. The specific configuration of each step of the manufacturing method for the organic EL display panel according to the present invention may also be changed.

The present invention is not limited to a simple matrix type, but can be applied to an active matrix type. In the case of an active matrix type, a plurality of signal lines are formed on the substrate where a plurality of electrodes are formed in a matrix, but these signal lines have relatively large electric resistance since the width thereof is narrow. The electric resistance of the signal lines in total can be decreased by forming the metal auxiliary electrodes so as to be in electrical contact with the signal lines, and the present invention can be applied to organic EL display panels using such a structure.

The insulators referred to in the present invention are not limited to such members as the anode separator 4 and cathode separator 7 in the abovementioned embodiments. The cathode separator 7 is narrow, so the auxiliary electrode 3 is severed so as to avoid the entire width of the cathode separator 7. If the cathode separator 7 is wide, however, the auxiliary electrode may be severed so as to avoid only the edges of the cathode separator.

The invention claimed is:

1. An organic EL display panel comprising a substrate, a plurality of transparent anodes formed on the substrate to extend in a first direction, a plurality of metal auxiliary electrodes formed on the anodes, respectively, to extend in the first direction, a plurality of cathodes extending in a second direction crossing the anodes and the auxiliary electrodes, an organic EL layer formed between each anode and each cathode, and a plurality of cathode separators extending in the second direction crossing the anodes and the auxiliary electrodes to electrically separate the cathodes from each other, wherein each of the transparent anodes is continuous in the first direction including a portion where the anode crosses each of the cathode separators, and wherein each of the auxiliary electrodes is continuous in the first direction between the cathode separators but discontinuous in the first direction at a position where the auxiliary electrode crosses each of the cathode separators.

2. The organic EL display panel according to claim 1, wherein the organic EL layer comprises a plurality of organic EL strips that cover the anodes and extend in the second direction to cross the anodes.

3. The organic EL display panel according to claim 1, wherein the cathode separator is made of a negative resist.

4. The organic EL display panel according to claim 1, further comprising an anode separator that covers the auxiliary electrodes and a part of the anodes, wherein the anode separator is formed with an opening between adjacent cathode separators.

5. The organic EL display panel according to claim 4, wherein each of the auxiliary electrodes is arranged to avoid the opening.

6. The organic EL display panel according to claim 5, wherein the anode separator is made of a positive resist.

* * * * *